(12) United States Patent
Kaya et al.

(10) Patent No.: US 7,626,793 B2
(45) Date of Patent: Dec. 1, 2009

(54) TRANSISTOR OVERCURRENT DETECTION CIRCUIT WITH IMPROVED RESPONSE TIME

(75) Inventors: Cetin Kaya, Plano, TX (US); James Teng, Dallas, TX (US); Claus Neesgaard, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 152 days.

(21) Appl. No.: 11/339,786

(22) Filed: Jan. 25, 2006

(65) Prior Publication Data

US 2007/0171591 A1    Jul. 26, 2007

(51) Int. Cl.
*H02H 3/08* (2006.01)
*H02H 9/02* (2006.01)
*H02H 3/00* (2006.01)
(52) U.S. Cl. ........................................ 361/93.1; 361/87
(58) Field of Classification Search ........................ None
See application file for complete search history.

(56) References Cited

U.S. PATENT DOCUMENTS

| 7,138,778 | B2 * | 11/2006 | Fujino et al. ................. 318/433 |
| 7,170,732 | B2 * | 1/2007 | Andersen et al. ............... 361/97 |
| 7,227,731 | B2 * | 6/2007 | Leith et al. .................. 361/93.1 |
| 2003/0067795 | A1 * | 4/2003 | Dubhashi ..................... 363/127 |

* cited by examiner

*Primary Examiner*—Albert W Paladini
*Assistant Examiner*—Dharti Patel
(74) *Attorney, Agent, or Firm*—John J. Patti; Wade J. Brady, III; Frederick J. Telecky, Jr.

(57) ABSTRACT

A circuit and method for determining overcurrent in a FET detects an output voltage of the FET in both a positive and negative polarity. The related positive or negative currents through the FET can be measured to determine whether an overcurrent condition exists. By measuring positive and negative currents in the FET, the overcurrent detector can obtain twice as much information as when measuring a positive current alone, and can respond more readily to overcurrent conditions. The overcurrent detector avoids the constraints typically observed in cycle-by-cycle PWM control with single polarity Vds sensing, while permitting a relaxation in the timing requirements for current sensing. A spike suppression circuit also contributes to longer sensing intervals.

6 Claims, 8 Drawing Sheets

TRANSISTOR OVERCURRENT DETECTION CIRCUIT WITH IMPROVED RESPONSE TIME

BACKGROUND OF THE INVENTION

Current detection in power FETS has long been used in a number of applications for a variety of purposes. For example, current detection may be used to help control the power FET or other components of a system in which the power FET resides. In most power switching applications, overcurrent detection can help identify potentially dangerous situations where a power FET may be conducting more than a rated current. Accordingly, overcurrent detection is highly desirable in power applications in which power FETs are used.

A particular power switching application where overcurrent detection is particularly useful is in class D power amplifiers. A particular issue that occurs with class D power amplifiers is increasing current that builds with each switching cycle of the amplifier output stage under certain conditions. In a number of class D power amplifiers, overcurrent detection in the above situation is difficult because conventional overcurrent detectors have a cyclic speed in the range of 100-150 ns. Due to the closed loop delay in detecting overcurrent, potentially damaging situations may arise that are not detected by the overcurrent detector until too late.

To overcome the above problem, an integrated overcurrent (OC) detector and gate drive control may be provided that can operate in close loop in a much shorter time frame. The coordination between the overcurrent detection and the gate drive control can detect an overcurrent and shut down a switching half bridge typically in under 46 ns. This type of detection and control, drawn from worst case models in high temperature conditions, becomes very challenging in noisy environments. In particular, current detection of a high side switch and a switching half bridge in a noisy environment with approximately 40V PVDD with reverse recovery events on the order of 10 amps and lasting 20-30 ns becomes very challenging. In addition, the coordination of the overcurrent detection and gate drive control can be somewhat complicated and add cost to the circuitry.

Typically, current detection for a FET can be achieved by measuring a voltage drop across the FET output, or the drain-source node. When the FET is conducting, and current flows from the drain to the source, the measured voltage drop is proportional to the current. The voltage is detected for a current falling in a single direction so that the polarity of the voltage is always the same when detected by the overcurrent sensor. Because FETs in these applications often experience negative voltages across their outputs, the overcurrent detector described above only detects current conditions in half of the possible number of voltage measurement situations. These types of overcurrent detectors do not obtain any information or have any knowledge of other states of the FETs, such as when the FET output voltage is negative. In a half bridge switching design, the lack of knowledge about two out of the four possible states for the output voltages of the two transistors provides a challenge in these types of overcurrent detectors to be designed with a very fast closed loop response, which can be complicated and expensive in practice.

Because overcurrent detectors with an overall response time of 100-200 ns are typically used to reduce costs and complexity for overcurrent sensing, systems using such overcurrent detectors sometimes suffer from drawbacks in the detection of overcurrent events. Some of these drawbacks are notable in class D audio amplifiers, and include such overcurrent issues as overcurrent detection holes and creeping current values. These drawbacks are particularly noticeable in cycle by cycle control in high voltage applications. The overcurrent detection hole refers to instances of overcurrent events that fall in between the overcurrent detection intervals, so that overcurrent events occur without being sensed. The creeping load current value drawback relates to a differential current measure, where the load current creeps upward over a number of switching cycles due to a finite response of the OC detector. The results of these overcurrent detection drawbacks are collapsing power supplies and the use of more expensive, bulkier and higher saturation current value inductors. An illustration of the difficulty with creeping overcurrent values is shown in the graph of FIG. 2. As can be seen in this cycle by cycle control example, with a supply voltage of 40 volts, the amperage increases with each cycle far above a desired amperage level, such as about 5A. Because the amperage reference is also adjusted higher, the overall overcurrent condition is not detected. Part of the difficulty in eliminating the creeping overcurrent value illustrated in the graph of FIG. 2 is that the closed loop cycle time for the overcurrent detector should be below approximately 50 ns, which is a difficult specification to obtain.

It would also be desirable to improve the speed of detection of an overcurrent detector in a switching half bridge. It would also be desirable to obtain an overcurrent detector that has a decreased close loop cycle time and provides robust performance in noisy environments for switching half bridges.

BRIEF SUMMARY OF THE INVENTION

In accordance with the present invention, there is provided an overcurrent detector that obtains an overcurrent measure for both positive and negative voltages on a high and a low side FET in a switching half bridge. The overcurrent detector can measure currents through the FETs when current is flowing in a positive or negative direction. By detecting and acting on currents that produce a negative Vds on both the high and low side FETs in a switching half bridge, all four cases for current flowing in the FETs can be examined. By obtaining the additional information on the currents through the FETs, the response time requirements for the overcurrent detector can be relaxed, resulting in a less complicated and less costly circuit realization.

Detection of negative Vds in the FETs switching half bridge also eliminates an overcurrent detection hole associated with state of the art overcurrent detectors. In some instances, overcurrent detectors have a slower response time than a PWM state or pulse width. The present invention permits the detection of overcurrent events where the PWM pulse width is less than the response time of the overcurrent detection circuit.

In accordance with one aspect of the present invention, negative Vds voltage on a FET is converted to a positive voltage and characterized using circuitry for measuring current through positive Vds measurements. Accordingly, existing circuitry can be reused and a simplified design can be realized with fewer components and less space taken than would otherwise be used for the doubling of functionality that is achieved.

In accordance with another aspect of the present invention, a method for overcurrent detection and response in a PWM switched half bridge circuit is provided. According to this method, negative Vds voltages are sensed on a high side and low side FET of a switching half bridge, together with a positive Vds voltage. When a positive Vds overcurrent event is detected, the remaining portion of the PWM cycle producing the positive Vds is skipped, or the state of the switches is reversed. The following PWM cycle is not skipped.

Alternately, or additionally, the detection of a negative Vds overcurrent condition can be used to cause the switches to maintain a state or cause the next PWM cycle to be skipped. Another response option is to turn both switches in the switching half bridge off, and maintain them off for a number of cycles, for example. By skipping cycles or cycle portions, or reversing or flipping switch states, the current flowing through the switching half bridge is typically reduced so that an overcurrent condition can be avoided.

In accordance with one aspect of the present invention, negative Vds to positive Vds conversion can be obtained so that a positive Vds sensing circuit can be reused with a negative Vds sense. A voltage polarity converter can be switched to the positive Vds sensing circuit to permit detection of negative voltage using some of the same circuitry. The positive and negative Vds sensing can take place on both the high and low sides of the switching half bridge. Negative Vds voltages can be measured with isolated semiconductor devices so that the negative voltages do not provide a potential for forward biasing the other circuitry, including the positive voltage sensing semiconductor devices.

Alternately, or in addition, positive and negative Vds voltage sensing is achieved with separate circuits coupled to a given high or low side FET. The Vds voltage sense circuitry is approximately doubled according to this technique, however, low voltage semiconductor devices may be used with level shifting circuitry.

According to another feature of the present invention, negative voltage leakage is improved by providing a blocking, isolated semiconductor device that permits negative voltage blocking. The device is placed in the path of the negative voltage leakage to improve performance of the overcurrent detector.

According to another exemplary aspect of the present invention, there is provided a positive and negative reference for one or both of the low and high side switches of a switching half bridge. The references are coupled to one comparator each, so that no more than two comparators are used to realize the overcurrent detector. Alternately, or in addition, the references or measured voltages may be switched in dependence upon measurement of high or low side switch Vds.

In accordance with another aspect of the present invention, an event-based spike suppression circuit is provided to diminish a voltage spike observed on an input of a high side overcurrent comparator, when the output swings from ground to PVDD. The spike suppression circuit avoids the need for a blanking interval, during which the output is permitted to stabilize prior to taking a current sense. The blanking interval is designed to avoid erroneous current sense readings that may occur as a result of obtaining a current sense during the voltage spike occurrence. In accordance with the present invention, the voltage spike is suppressed so that the blanking interval is unnecessary, significantly expanding the interval during which a current sense reading may be obtained.

According to an advantage of the present invention, the overcurrent detection holes and creeping overcurrent reference values can be avoided or eliminated. Portions of positive Vds measurement circuitry can be reused for negative Vds sensing, to permit a relative reduction in overall overcurrent detection size while doubling the functionality. Positive and negative Vds sensing may be obtained with p-type or n-type semiconductor devices, with an advantage in size for p-type devices.

BRIEF DESCRIPTION OF THE SEVERAL VIEWS OF THE DRAWINGS

The present invention is described in greater detail below, with reference to the accompanying drawings, in which.

DETAILED DESCRIPTION OF THE INVENTION

Figure 1:
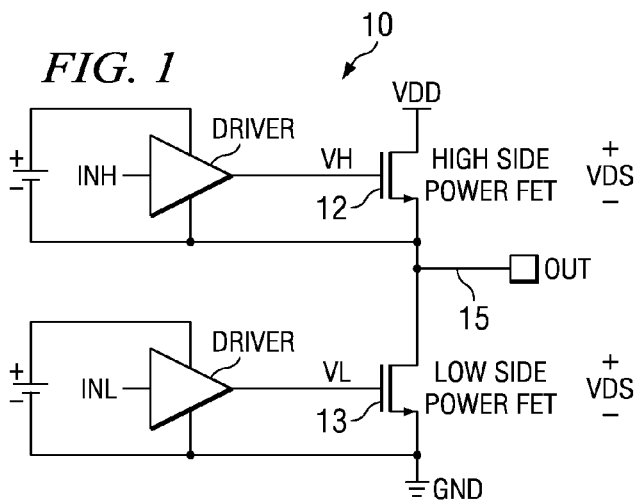
FIG. 1 is an illustration of a switching half bridge.

Referring now to FIG. 1, a circuit diagram of a switching half bridge is illustrated as circuit 10. Circuit 10 includes a high side FET 12 and a low side FET 13, that provide a switched output at a common node 15. Node 15 is typically connected to a load that can be inductive. When FETs 12 and 13 are switched using a PWM control arrangement, the voltages across the drains and sources of FETs 12 and 13 can be positive or negative, related to current flow in FETS 12, 13. When the voltage is positive, as indicated by the polarity on the outputs of FETs 12 and 13, voltage Vds for FETs 12 and 13 is positive and current flows in a positive direction from (+) to (−). An overcurrent detector can be connected to FETs 12 and 13 to determine current through the FETs based on the positive voltage Vds. Conventionally, an overcurrent sensor would detect the positive voltage Vds to measure the current through the corresponding FET. Accordingly, such an overcurrent detector would work when the current was flowing in a single direction only.

In accordance with a preferred embodiment of the present invention, an overcurrent detector on the outputs of FETs 12 and 13 detects both a positive and a negative voltage Vds on the outputs of FETs 12 and 13. In a PWM switching configuration, the currents and the voltages across the outputs of FETs 12 and 13 can be both positive and negative. A preferred embodiment of the present invention permits the measurement of both positive and negative Vds voltages, even during the same switching cycle. For example, if Vds is positive and experiences a change in voltage to a negative value, the overcurrent detector according to a preferred embodiment of the present invention can still measure voltage Vds and determine the current flowing through the FET to sense whether an overcurrent condition may exist.

By sensing the current through the FETs in both a positive and negative direction, a preferred embodiment of the present invention eliminates a creeping overcurrent value that is difficult to detect or respond to in cycle-by-cycle control configurations. In cycle-by-cycle controlled power circuits with conventional overcurrent response circuits, the current in the switching half bridge can reach dangerous levels without being detected by the overcurrent detectors due to the lack of sufficient response time in the overcurrent detector. A preferred embodiment of the present invention permits overcurrent detection in a cycle by cycle control to eliminate the overcurrent detection blind spot that is present in conventional designs. Accordingly, a preferred embodiment of the present invention does not require high speed detection, which can be costly and complex. The requirements for overcurrent detection timing can be relaxed, so that adequate overcurrent protection is obtained even when fast PWM cycle by cycle control is used. That is, if the PWM pulses are smaller than the time interval needed by the overcurrent detector, adequate overcurrent protection is still obtained through measurement of both the positive and negative voltages on the FETs in the half bridge. Accordingly, the overcurrent detection solution of a preferred embodiment of the present invention provides a more robust solution for overcurrent detection, without adding complexity or cost.

Figure 2:
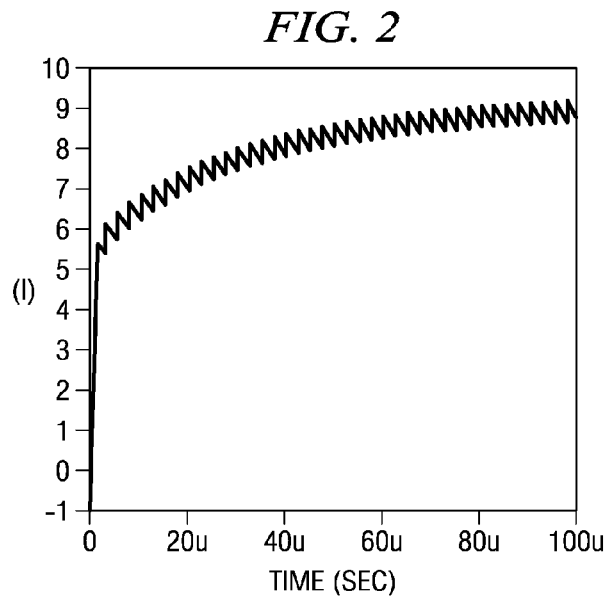
FIG. 2 is a graph illustrating overcurrent detection reference creep.

Referring now to FIG. 2, a graph illustrating the difficulty of an increasing overcurrent detection reference in a cycle by cycle control is shown. The graph shows a transient response of current over the course of time, where the current limit increases with each switching cycle. Although the current should be limited to a value in the range of 5.5 Amps, the current buildup during OC sensor response time causes the current response to approach 9 Amps over the course of 0.1 ms. The transient response of the graph in FIG. 2 was obtained with a short of the half bridge output, to purposely increase the current draw to cause an overcurrent trip.

Figure 3:
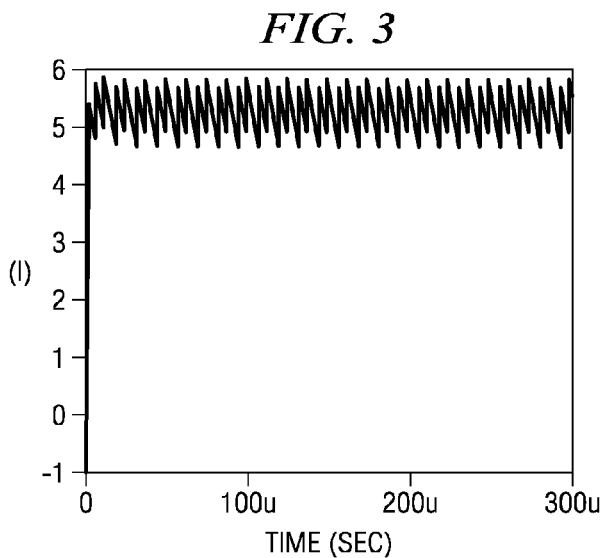
FIG. 3 is a graph illustrating overcurrent detection response in accordance with the present invention.

Referring now to FIG. 3, in accordance with a preferred embodiment of the present invention the graph illustrating a transient response of the current in the output of a switching half bridge is shown. The transient response of the graph in FIG. 3 is obtained under the same shorting conditions as the transient response obtained in the graph of FIG. 2. However, the overcurrent condition is detected in the graph of FIG. 3 due to the use of negative and positive Vds sensing. Accordingly, the maximum current in the overcurrent condition never exceeds 6 amps, even over an interval of 0.3 ms.

Figure 4A:
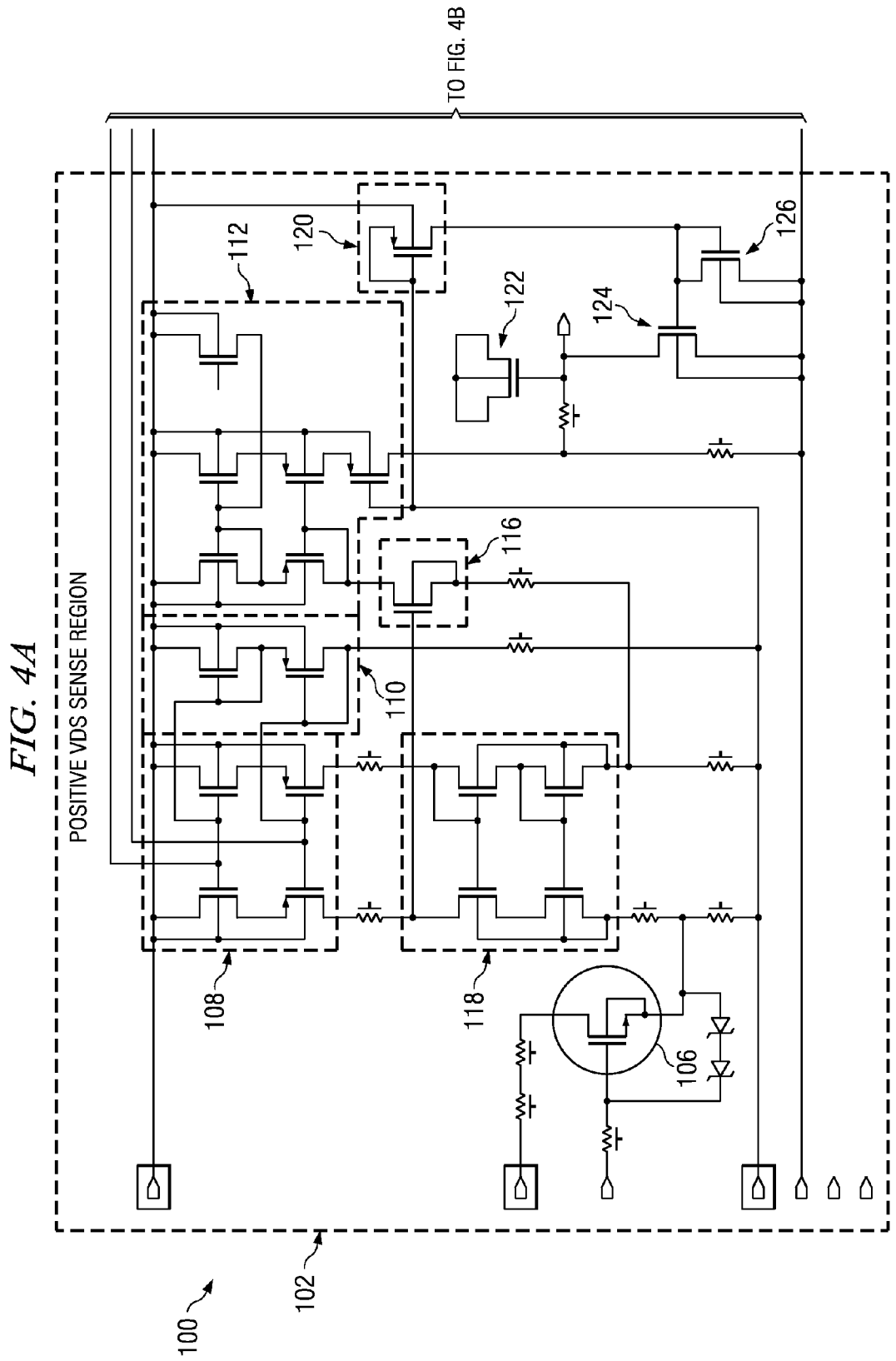
FIG. 4A is a circuit diagram illustrating positive Vds sensing in accordance with a preferred embodiment of the present invention.
Figure 4B:
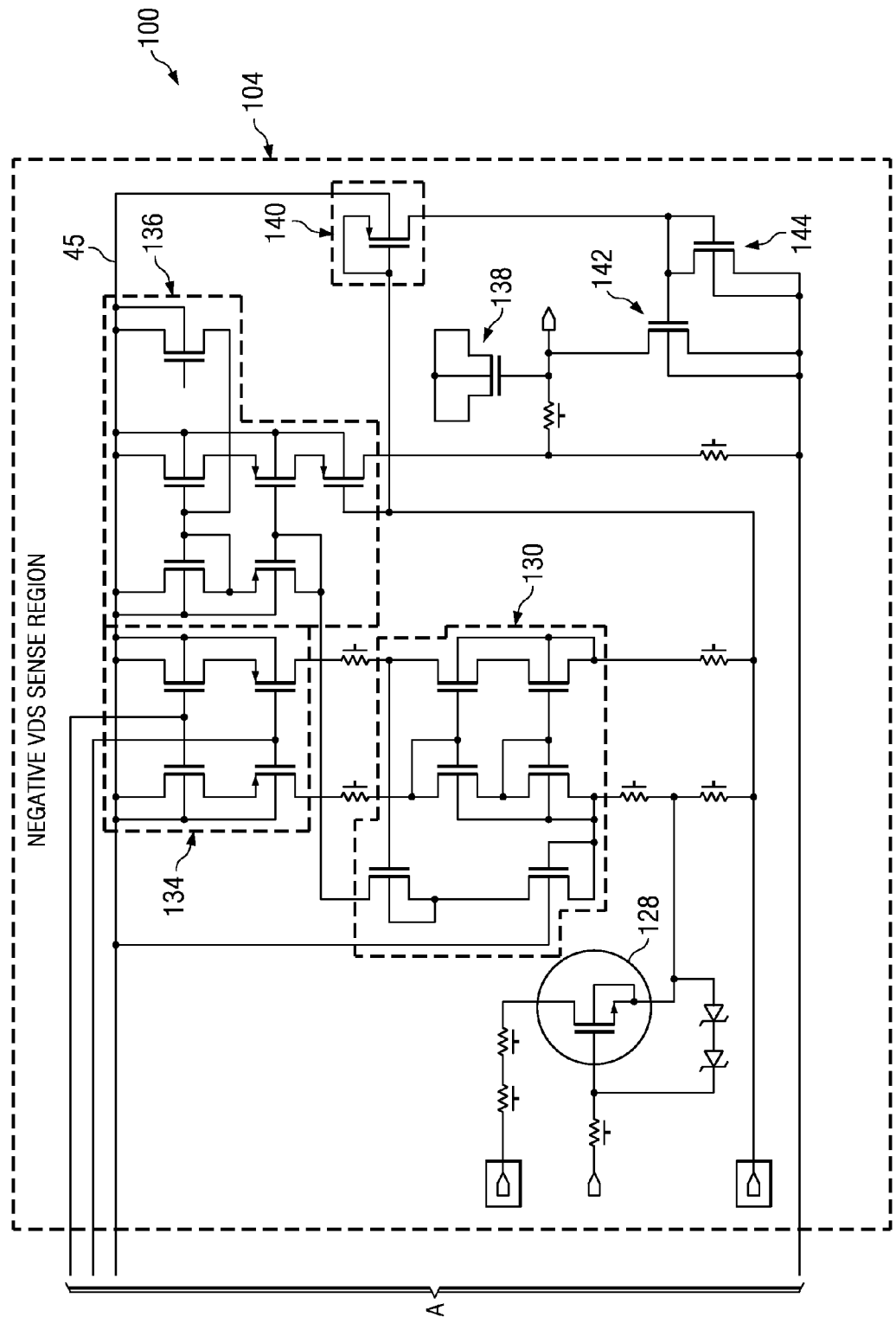
FIG. 4B is a circuit diagram illustrating negative Vds sensing in accordance with a preferred embodiment of the present invention.

Referring now to FIGS. 4A and 4B, a circuit for implementing the negative and positive Vds sensing of the separate power FETS in a switching half bridge is illustrated generally as circuit 100. Circuit 100 includes a positive Vds sense region 102 and a negative Vds sense region 104. In the exemplary embodiment illustrated as circuit 100, a number of elements in regions 102 and 104 are duplicated, so that the potential for re-using circuitry is readily available. Region 104 is implemented to have n-type components provide the Vds sense output.

With respect to FIG. 4A, positive sense region 102 can be seen. Region 102 includes n-type devices and components for detecting positive Vds voltages and reporting a current value related to the sensed positive Vds voltage. FET 106 receives the positive Vds signal or voltage from a high side FET (such as FET 12). FET 106 is coupled to comparator 118. Coupled to comparator 118 is current mirror 108, which receives a reference current from source 110. A level shift 112 is also coupled to the comparator 118 through an nMOS feedback device or FET 116 that level shifts the Vds sense signal output form a high voltage to low voltage domain. Additionally, a spike suppressor (comprised of capacitor-connected FET 122 and FETs 120, 124, and 126) that can diminish an observed voltage spike.

Referring now to FIG. 4B, specific portions of negative Vds sense region 104 are illustrated. Region 104 includes n-type devices and components for detecting negative Vds voltages and reporting a current value related to the sensed negative Vds voltage. FET 128 receives the negative Vds signal or voltage from a low side FET (such as FET 13). FET 128 is coupled to comparator 130. Coupled to comparator 130 is current mirror 134. A level shift 136 is also coupled to the comparator 118 through an nMOS feedback device or FET 116 that level shifts the Vds sense signal output form a low voltage to high voltage domain. The positive level shift 136 is provided to obtain an appropriate sense level for the negative Vds voltage. In addition, negative Vds voltage can be converted to a positive value to permit some sensing circuitry to be reused. The circuitry added in conjunction with such a conversion increases the high voltage section by about double, or 100%.

Sense region 104 also includes a spike suppressor that is an event-driven voltage limiter. The spike suppressor (comprised of capacitor-connected FET 138 and FETs 140, 142, and 144) that can diminish an observed voltage spike. Preferably, suppressor diminishes the voltage spike observed on an input of a high side overcurrent comparator during output swings from ground potential to PVDD, as discussed in greater detail below. Sense region 104 obtains a negative Vds value for a high or a low side FET in a switching half bridge, so that output current can be measured for twice as many events.

Figure 5:
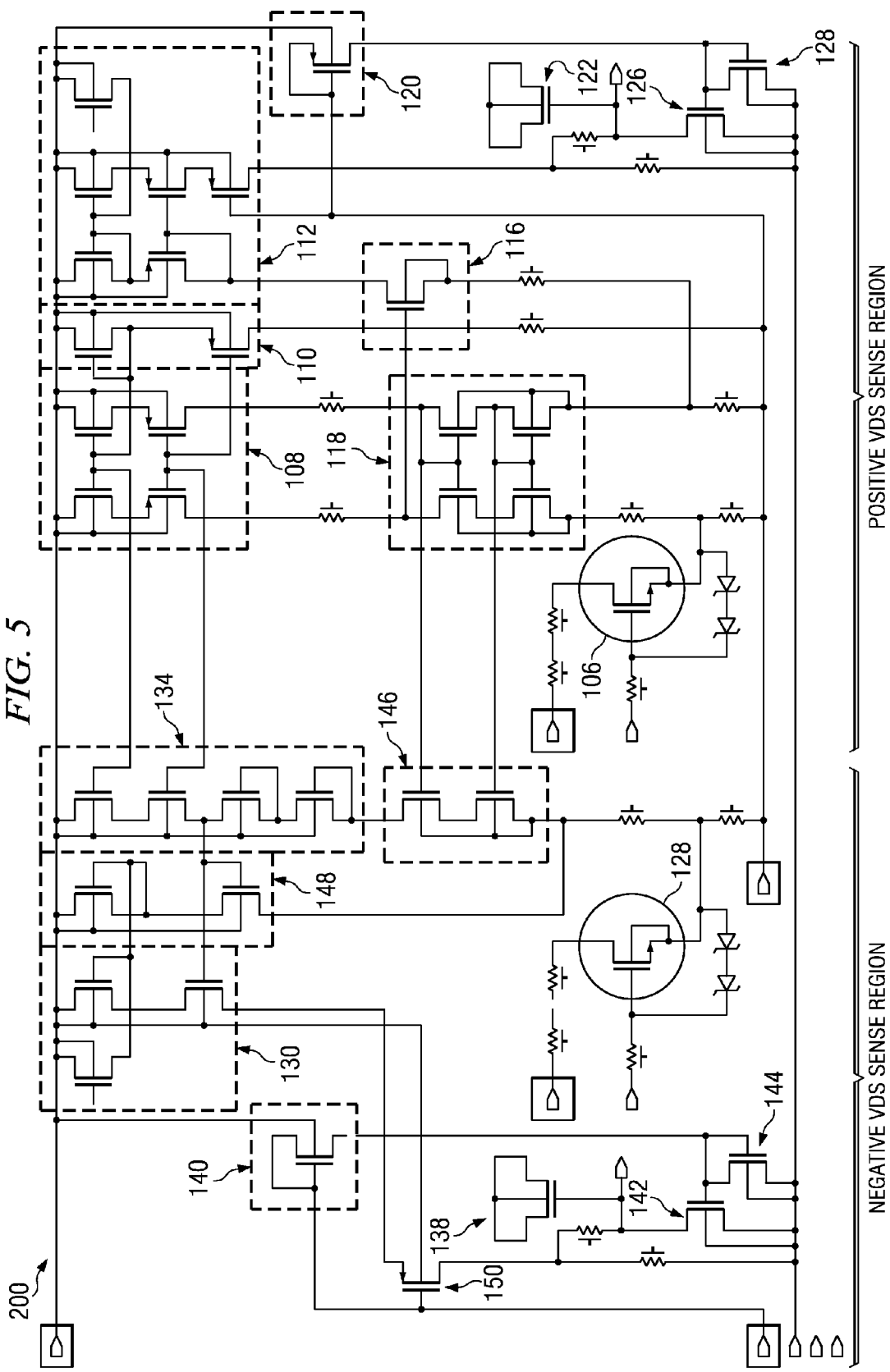
FIG. 5 is a circuit diagram illustrating negative and positive Vds sensing in accordance with a preferred embodiment of the present invention.

Referring now to FIG. 5, a circuit diagram of a Vds sense circuit 60 is illustrated. Circuit 60 provides a negative Vds sense using negative Vds sense region 62 and develops a measure for current through a high or low side FET in a switching half bridge, using p-type semiconductor devices and components. In comparing circuit 200 with circuit 100, it is apparent that the realization of the negative Vds sense using sense region is less complicated and uses less components than corresponding sense region 102 realized with n-type semiconductor devices and components. Further reductions in circuitry or components may be realized if the sensed Vds voltage is converted from negative to positive values to reuse the positive Vds sense circuitry. This approach permits negative Vds sensing to be achieved with an increase in overall circuitry or components of about 50% beyond that for positive Vds sensing alone. FETs of device 146 and FETs from comparator 118 form the comparator for the negative Vds sense region and are used to develop the negative sense voltage. Additional high voltage isolation may be used, such as 20V isolated pMOS, for example.

Another reason for the reduced complexity in the p-type circuitry is the ability to switch the p-type devices without having to drive the devices at the level of the high voltage rail. In addition, grouping p-type devices together is typically easier, leading to reduced space used in the realization. P-type transistors also have an advantage in reducing the number of current mirrors used in the realization, since the feedback transistor is not switched. Negative Vds sense region 62 realizes all the functionality of sense region 102, but in a smaller space and with less components, to achieve an overall reduction in size and complexity.

Figure 6:
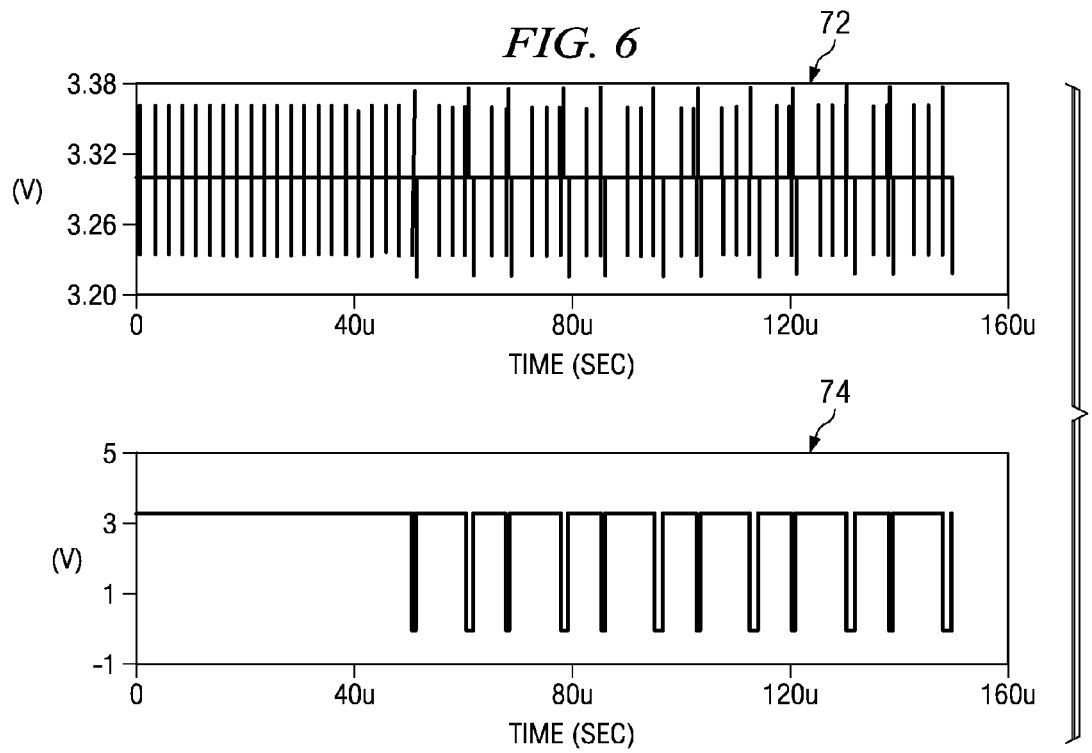
FIG. 6 is a set of graphs illustrating elimination of an overcurrent detection hole.

Referring now to FIG. 6, a graph illustrating separate transient responses 72 and 74 is illustrated. Transient response 72 demonstrates the case when overcurrent protection is performed with positive Vds sensing alone. Transient response 74 shows the case of overcurrent detection with positive and negative overcurrent detection. In transient responses 72, 74, the output of the switching half bridge being observed is shorted to PVSS to produce an overcurrent condition. Transient response 72 shows continued half bridge switching in each PWM cycle, even though an overcurrent condition exists. Accordingly, transient response 72 illustrates the overcurrent detection hole that exists when only positive Vds sensing is undertaken to detect overcurrent conditions. In transient response 74, positive and negative Vds sensing is used to detect overcurrent conditions. As can be seen from the interruption of the output in transient response 74, the PWM switching cycles are cut short or suspended when the overcurrent condition is detected. Transient response 74 thus illustrates the detection of overcurrent conditions that would formerly have gone unnoticed in the case where only positive Vds sensing was used. The PWM cycle used in transient responses 72, 74 is 80 ns in length, which can be significantly shorter than the overcurrent detection cycle time. By providing both positive and negative Vds sensing in transient response 74, the system is able to respond to an overcurrent condition, even though the overcurrent detection cycle time may be greater than a PWM switching interval.

Figure 7:
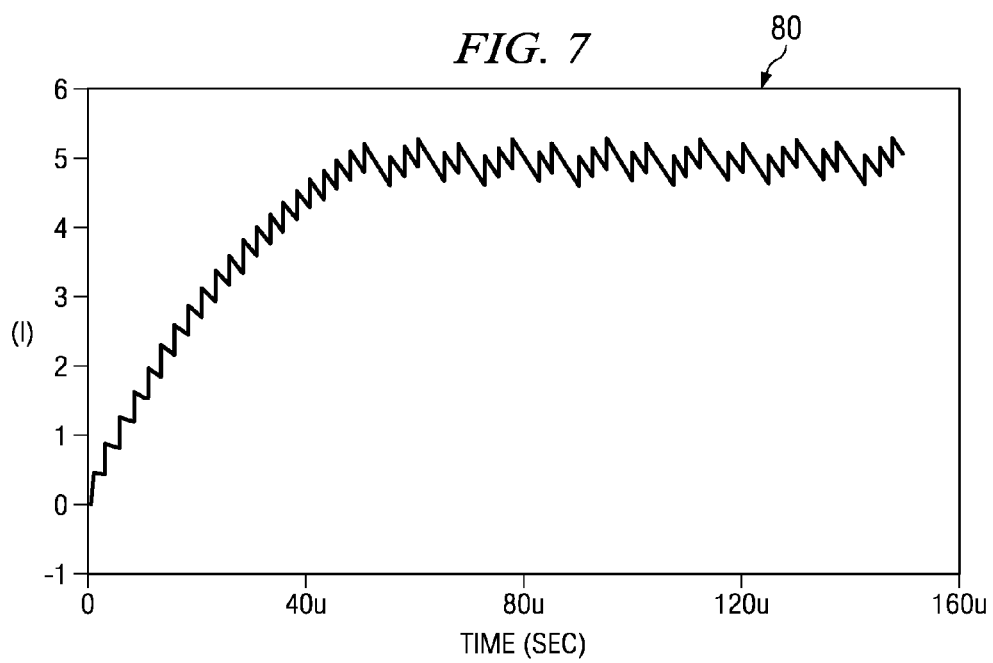
FIG. 7 is a graph illustrating the triggering of a response to an overcurrent condition.

Referring now to FIG. 7, a graph 80 of the current in a transient response wave form during an overcurrent condition in the switching bridge is illustrated. The transient response was obtained under the conditions of PVDD being 40 v, PWM cycle time being 80 ns and the switching half bridge output is shorted to PVSS. The PWM cycle for this cycle-by-cycle control of the switching half bridge has a period of approximately 80 ns, indicating the possibility of an overcurrent detection gap because of the much longer overcurrent detection cycle time. However, as illustrated in graph 80, the overcurrent detector according to a preferred embodiment of the present invention prevents the current from rising substantially beyond 5.0 Amps, indicating that the use of both positive and negative Vds sensing eliminates the previous gap that would permit an overcurrent condition to go undetected. Accordingly, not only does a preferred embodiment of the present invention prevent the overcurrent detection problem with an increasing overcurrent drift, as illustrated in FIGS. 2 and 3, but it also prevents the lack of detection due to the overcurrent detection gap previously seen with positive Vds sensing alone. The overcurrent condition is detected with negative Vds sensing and appropriate control steps are taken to reduce or eliminate the overcurrent condition.

In an exemplary embodiment of the present invention, the PWM control applied to the switching half bridge is modified in response to the detection of an overcurrent condition. For example, when an overcurrent condition is detected using a positive Vds sense, the remaining portion of the PWM cycle that produces the positive Vds voltage is skipped. Accordingly, the remainder of the PWM cycle provides no switching transitions for the switching half bridge. However, the following PWM cycle is applied as scheduled. Note that a positive Vds voltage may not be generated in the next PWM cycle. When an overcurrent condition is detected through a negative Vds sense, the remainder of the PWM cycle is applied as scheduled, but the next PWM cycle is skipped. By skipping the following PWM cycle when an overcurrent condition is detected through negative Vds sensing, the control effectively shuts down the switching half bridge for the PWM cycle to permit current levels to fall off. Note that the following PWM switching cycle may not necessarily produce a negative Vds voltage for overcurrent sensing. It should also be apparent that skipping cycles or an on-phase of a switch can be applied to any switch, whether positive or negative Vds voltage measurement indicates an overcurrent.

According to another exemplary embodiment of the present invention, the PWM control can be applied to cause state flipping when an overcurrent condition is detected. State flipping simply turns off a different switch from that for which the overcurrent condition is detected. The different switch may be turned off for a following control cycle, for example. The state flipping operation tends to reduce the overcurrent detected, without shutting off both switches in the switching half bridge.

With reference to FIG. 1, another exemplary embodiment of the present invention provides for a number of states for high side FET 12 and low side FET 13 for the application of negative Vds sensing, and a corresponding control response in the event of an overcurrent condition. The different states are defined by the state of FETs 12 and 13 and the direction of current flow through node 15. FETs 12 and 13 typically operate in complimentary order, such that FET 12 is off when FET 13 is on, and vice versa. The complimentary switching of FETs 12 and 13 avoids current shoot through conditions in which source voltage Vdd is directly connected to ground potential with a low impedance connection. The switch condition where FET 12 is on and FET 13 is off is often referred to as a "1" condition meaning that the switching half bridge composed of FETs 12 and 13 is in one state where supply voltage Vdd is coupled to the output node 15. In a "0" condition, FET 12 is off and FET 13 is on indicating that node 15 is coupled to ground potential. In either a 1 or 0 condition, the current supplied through node 15 can flow either towards the load or output or from the load or output. Accordingly, the two different switching states in conjunction with the two different directions of current flow through node 15 and the load or output leads to four potential states for sensing Vds voltage to detect an overcurrent condition. The switch states and current flow and respective Vds sensing are summarized in Table 1 below. Table 1 also includes a switching response that is dependent upon the state when an overcurrent condition is sensed.

TABLE 1

| SWITCHING STATE OVERCURRENT AND CURRENT FLOW | VDS SENSING | SWITCHING RESPONSE |
| --- | --- | --- |
| Current inflow and 1 switch state | Negative sense of high side switch | Maintain state |
| Current inflow and 0 switch state | Positive sense of low side switch | Reverse state |
| Current inflow and 1 switch state | Positive sense of high side switch | Reverse state |
| Current inflow and 0 switch state | Negative sense of low side switch | Maintain state |

One of the features of the response to an overcurrent condition includes maintaining a switch state, which can be maintained indefinitely. For example, when the switch state is a 1 with current in flow to the half bridge node, and a negative Vds sense of the high side switch detects and overcurrent condition, the switch state can be maintained for the remainder of the PWM cycle. Alternatively, or in addition, the switch state may be maintained for a number of PWM cycles, or some particular time interval, such as until the current detected through the high side switch with a negative Vds sense falls below a given threshold. By maintaining a switch state when an overcurrent is sensed, the half bridge can dissipate current in one or more control cycles, so that current through the high side switch is limited. The negative Vds voltage sense therefore provides an additional protection for high side FET 12 that is not available in conventional overcurrent sense circuits.

Similarly, when an overcurrent is detected with a positive Vds voltage sense, the switch state can be reversed to contribute to dissipating current during the control cycle in which the overcurrent is detected. By switching or reversing the state of the switches, the circuit configuration leading to the overcurrent condition is modified to permit the overcurrent to be dissipated.

Another response that may be provided when an overcurrent is detected is turn off the high side and low side FETs 12, 13 during the control cycle in which the overcurrent is detected, or for a number of cycles. Turning off high side and low side FETs 12, 13 contributes to isolating the output from the load, which may be useful in the case of a load short circuit or transient power spike.

An exemplary embodiment of a method and circuit for sensing negative Vds voltage is described below. It should be apparent that a number of different techniques may be used to sense negative Vds voltage and the following description is not meant to be limiting in any way. In accordance with the present invention, negative Vds voltage is sensed and converted to a positive Vds voltage to obtain a current sense for a negative current flow. Separate negative Vds measurements may be taken for high and low side FETs 12, 13 in the switching half bridge. The separate measurements may be taken based on different circuitry used for the high voltage and low voltage environments in the switching half bridge. Negative Vds sense reference voltages may also be provided separately for the high and low side portions of the switching half bridge.

Figure 13:
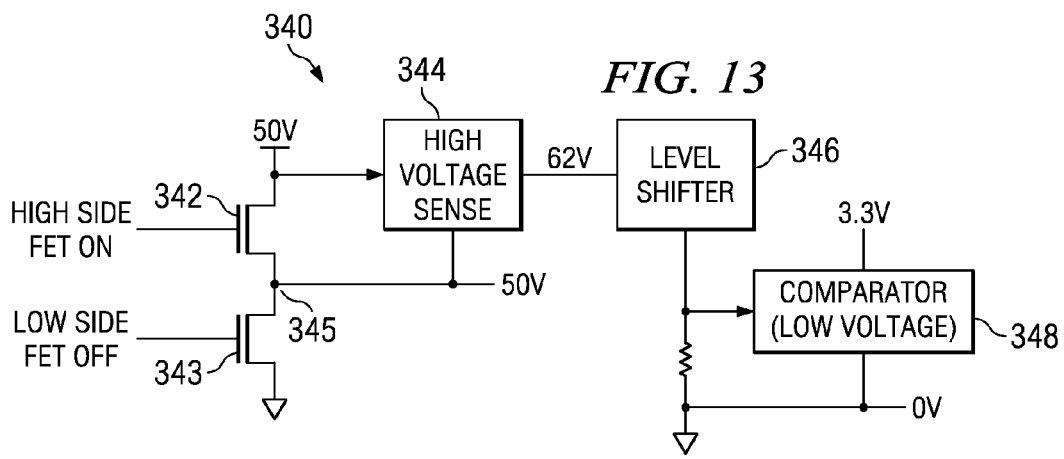
FIG. 13 is a circuit diagram illustrating measurement of high side Vds voltage in accordance with a preferred embodiment of the present invention.
Figure 14:
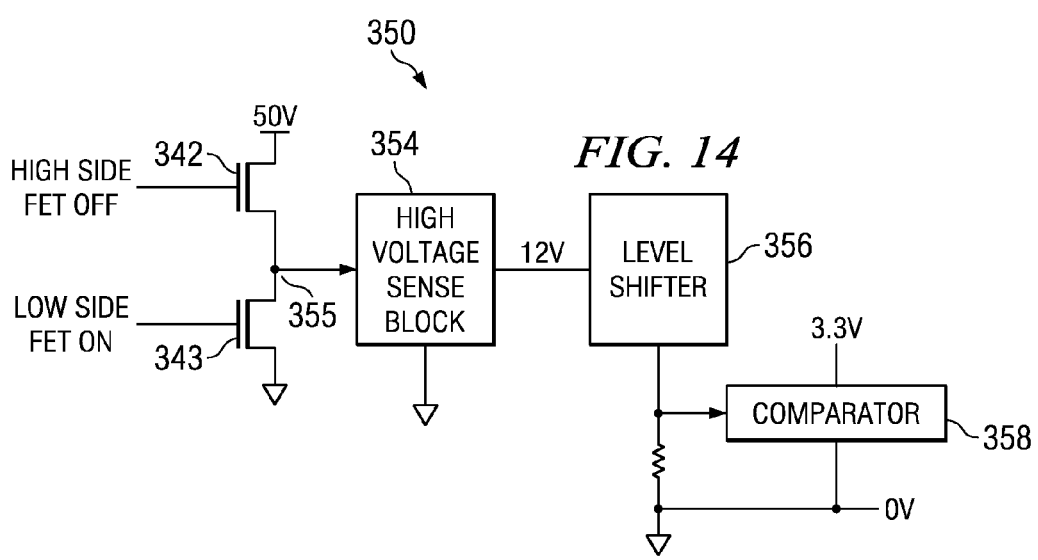
FIG. 14 is a circuit diagram illustrating measurement of low side Vds voltage in accordance with a preferred embodiment of the present invention.

Referring for a moment to FIGS. 13 and 14, circuitry for measuring Vds voltage on high and low side FETs 342 and 343 is illustrated generally as circuit 340 and 350, respectively. Circuit 340 measures high side Vds voltage on FET 342 using a high voltage sense block 344. Block 344 measures Vds voltage across high side FET 342 based on a 12 volt range in this exemplary embodiment. That is, when high side FET 342 is on, high voltage sense block 344 provides a voltage sense signal based on a range between approximately 50 volts and 62 volts. A level shifter 346 changes the voltage reference level to a level suitable for use with a comparator 348. Comparator 348 operates in a low voltage domain, such as a 3.3-volt range suitable for use with microelectronics. High voltage sense block 344 is capable of sensing positive and negative voltages, depending upon the current flow in node 345 into or out of high side FET 342.

In circuit 350, a high voltage sense block 354 detects Vds voltage for conducting low side FET 343. As with circuit 340, high voltage sense block 354 may detect voltage in a range of approximately 12 volts in this exemplary embodiment. The 12 volt range for Vds voltage measurement is level shifted to a 3.3 volt range with level shifter 356 for use by comparator 358. High voltage sense block 154 can measure positive and negative Vds voltage across low side FET 343, in dependence upon current flowing in node 155. For example, current flowing from node 355 through low side FET 343 to ground will be measured as a positive current, while current flowing through low side FET 343 to node 355 is measured as a negative current. Accordingly, high voltage sense blocks 344, 354 sense high voltage ranges for detecting Vds voltage, and can convert a negative sensed voltage into a positive sense voltage for use by comparators 348, 358.

Figure 15:
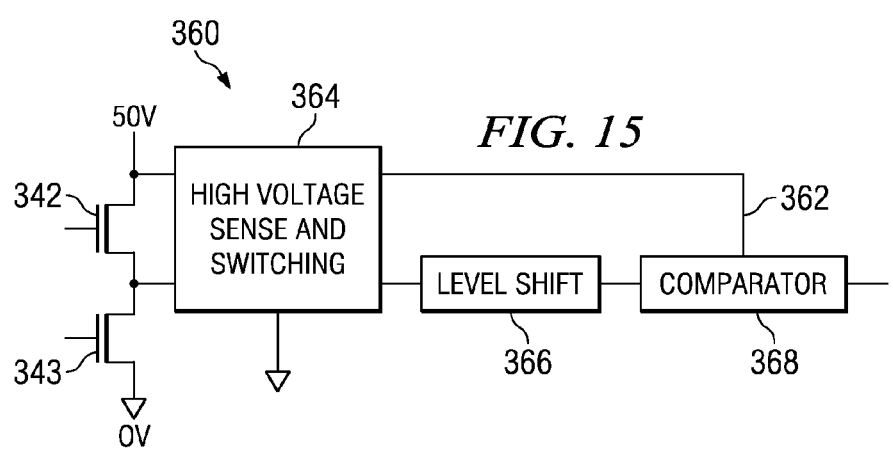
FIG. 15 is a circuit diagram illustrating measurement of high and low side Vds voltage in accordance with a preferred embodiment of the present invention.

Referring now to FIG. 15, the features of circuits 340 and 350 are combined into a circuit 360. Circuit 360 includes a high voltage sense block 164 that is operable to sense negative and positive voltages, and switch between sensing of high side FET 342 and low side FET 343. According to this configuration, high voltage sense block 364 can reuse circuitry to provide an overall savings in silicon used to implement a preferred embodiment of the present invention. In addition, the implementation in circuit 360 avoids the use of two level shifters and two comparators. High voltage sense block 364 is configured to have switch circuitry to switch an appropriate sense circuit to the FET for which Vds voltage is measured. High voltage sense block 364 also is configured to switch between voltage references provided to comparator 368. A voltage reference 362 provided to comparator 368 may be set to be different for positive and negative Vds sensing, and may also be set to be different for high and low side Vds measurements.

Circuit 360 has the potential to further reduce the silicon requirements for realizing the circuit according to a preferred embodiment of the present invention. The embodiments illustrated in FIGS. 4-6 provide separate positive and negative Vds measurements, which may be supplied to separate comparators with corresponding positive or negative thresholds. In contrast, the embodiment in FIG. 15 permits a single comparator to be used, with additional switching circuitry. The positive and negative Vds sense circuitry can both be active at the same time, or switched to be active as needed, as illustrated in FIG. 15.

Figure 8A:
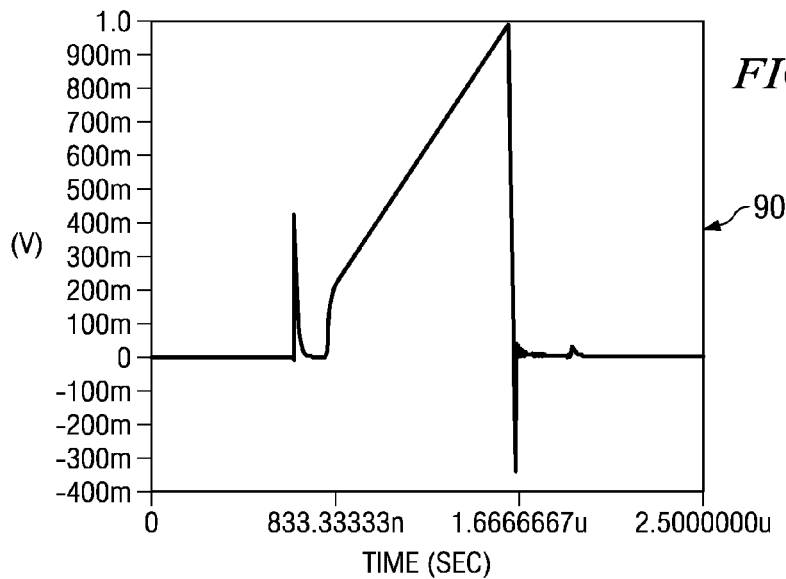
FIGS. 8A and 8B are graphs illustrating event based spike suppression in accordance with a preferred embodiment of the present invention.

Referring now to FIGS. 4A, 4B, 8A, and 8B, another aspect of a preferred embodiment of the present invention is illustrated with respect to spike suppression in the detection of voltage Vds. The spike suppression circuit is illustrated in FIGS. 4A and 4B. FIG. 8A shows in graph 90 a typical voltage spike experienced during switching that makes a reading on voltage Vds difficult due to errors that may be observed by the voltage sense in the presence of the spike. In accordance with a preferred embodiment of the present invention, an event driven spike suppression circuitry is provided that is active to reduce the voltage spike during transition or switching times. The voltage spike on the input of the high side overcurrent comparator occurs when the output swings from ground to voltage PVDD.

In prior techniques, the spike is suppressed using a time based blanking technique, so that no measurements are taken during the blanking period to permit the spike to subside. However, the time based blanking technique typically takes the worst case into account, meaning that the blanking period is significant with respect to the overcurrent detection response time. Worst case blanking intervals are typically based on tolerances related to manufacture of the switching components, and their characteristics over a range of operating temperatures.

A preferred embodiment of present invention provides an event based spike suppressor that uses the capacitive coupling of a transistor configuration in the overcurrent circuit. When the output of the half bridge circuit swings from ground to voltage PVDD, the spike suppressor is active and substantially reduces the voltage spike through capacitive coupling.

A dead time control (DTC) input, used as the gate drive input for the low voltage switch, is also used as a signal for blanking control. As the gate drive turns off, the signal is used to shutoff additional blanking operation. The spike suppressor is also driven by the input signal to the low side switch of the half-bridge during turnoff. The spike suppressor senses FET turn-off and shuts itself off before FET turnoff to avoid high Vds voltages, which increase as Vgs decreases during turnoff.

During FET turn on, the spike suppressor is output dependent and waits until the FET is out of saturation range to become active. In the exemplary embodiment illustrated in FIGS. 4A and 4B, a cascoded 50-volt depMOS provides the capacitive coupling used to reduce the voltage spike when the output voltage swings from ground to PVDD. The event based spike suppressor contributes to removing the impact of process tolerances in the construction of the semiconductor devices. Similarly, the impact of high temperature tolerances is reduced or removed with the spike suppression technique. In addition, spike suppression circuit assists in providing a cleaner input signal to the voltage comparator to provide a more robust feedback.

The blanking control with spike suppression can operate according to at least three different control techniques, depending on operating conditions, for example. A logic blanking technique is used to prevent false triggering and is based simply on gate drive signals to the switches. A sense blanking technique monitors the output voltage, with an IdMOS device, for example, and determines when a blanking interval may end. The spike suppressor can be used in the sense blanking technique. A third technique is applied as power blanking, which is based on output transitions, and depends upon the switches coming out of saturation, for example. Due to the spike suppression used in the low voltage switch operation, the blanking interval can be reduced.

Figure 8B:
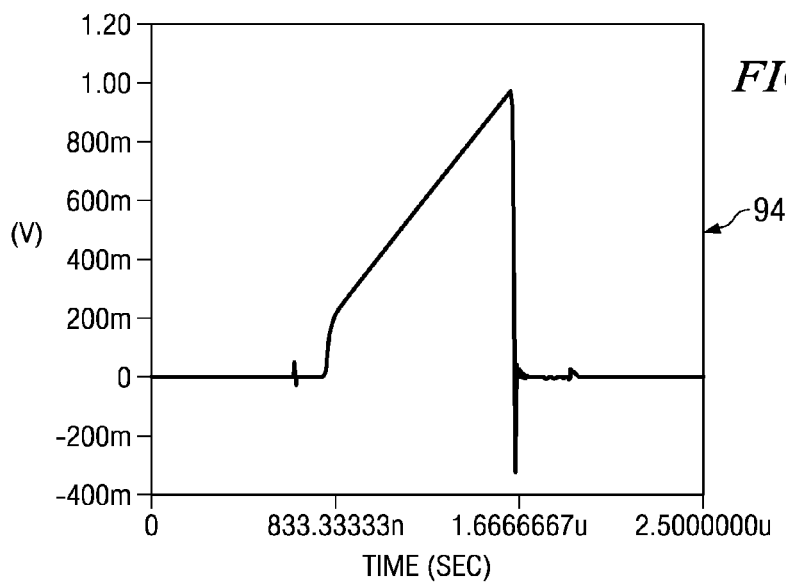

Referring to FIG. 8B, graph 94 illustrates the input voltage waveforms provided to the overcurrent comparator with the spike suppression active during the transition period. As can be seen in graph 94, the initial voltage spike is substantially reduced, and a significant amount of time during the sensing period is available that would otherwise be unused with a blanking control.

Typically, to prevent false triggering, a blanking control used with the gate driver during the switching transition removes approximately 40 ns during turn on and approximately 10 ns during the turnoff stage. These lost time amounts are recovered using the event driven spike suppressor of a preferred embodiment of the present invention. In an exemplary embodiment, an output of the overcurrent comparator is gated with a dead time control circuit to reduce or eliminate a blanking period in the low voltage domain.

Figure 9:
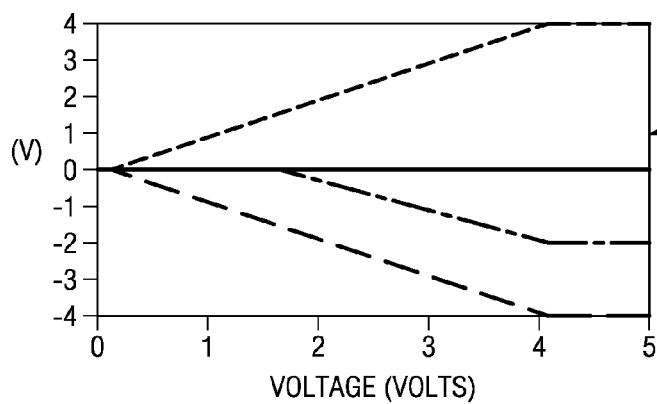
FIG. 9 is a graph illustrating negative voltage leakage.
Figure 10:
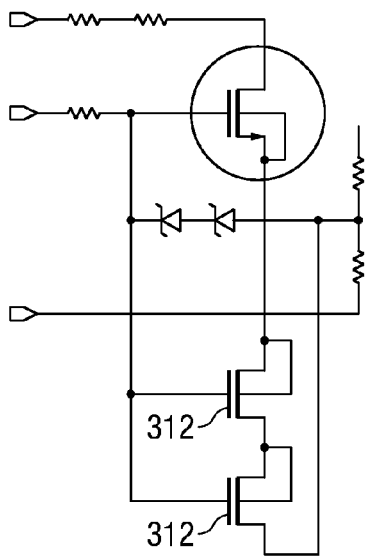
FIG. 10 is a circuit diagram illustrating the use of blocking transistors to overcome negative voltage leakage in accordance with a preferred embodiment of the present invention.

Referring now to FIG. 9, a graph 96 showing high side transient response characteristics when the gate input to the overcurrent circuitry is zero, while the high side switch is in an off state is illustrated. A leak in negative voltage occurs beginning at negative 1.5 volts illustrated in graph 96. This negative voltage leakage can be improved by adding a blocking isolated device, such as an nMOS device, configured to be in reverse orientation to cut off a diode conduction path. Certain types of isolated blocking devices may produce a penalty on the current sense gain derived from measuring voltage Vds. This penalty can be reduced by provided high threshold voltage isolated blocking devices, which can even be implemented in low voltage transistor devices. An exemplary circuit of either FET 106 or 108 that includes nMOS blocking transistors 312 is illustrated in FIG. 10.

Overcurrent detection using Vds voltage sensing operates through the use of a reference voltage for comparison purposes. According to an exemplary embodiment of the present invention, a negative Vds voltage reference is generated to provide overcurrent detection when negative Vds voltage is sensed.

When a positive Vds sense is taken for both the low side and high side overcurrent detector, an LDMOS may be used where current is forced into the drain of the LDMOS and the gate is tied to reference GVDD. The resulting Vds voltage forms a positive reference for use in overcurrent detection.

The negative Vds voltage reference may be provided separately for the high side and the low side of the switching half bridge. For a high side negative reference, a reverse biased LDMOS may be used, where current is forced into the source of the LDMOS, with the gate tied to reference voltage GVDD. The resulting Vds voltage can optionally be attenuated by approximately 10% to account for voltage differences in the gate to channel voltage.

For the low side overcurrent detector negative reference, the high side negative reference is used and provided to a high voltage depMOS device with the drain of the device tied to the source of the reverse LDMOS. Typically, the depMOS may be a 50 volt device, and is provided to emulate the substrate diode consisting of the drain to P substrate junction of the low side FET. Accordingly, this device forms the negative reference for the low side switch, separate from the high side overcurrent detector negative reference.

Figure 11:
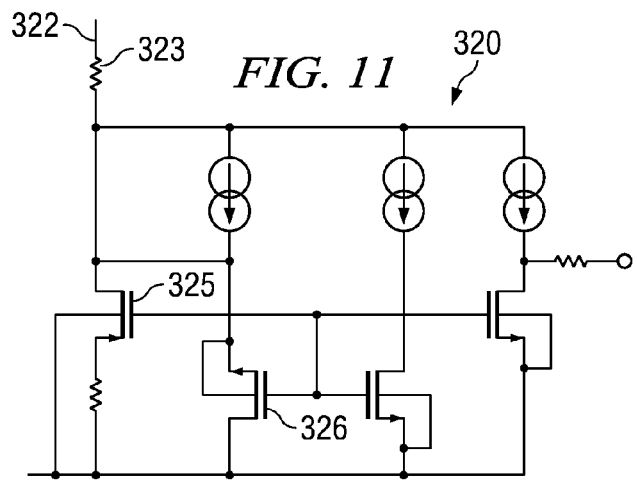
FIG. 11 is a circuit diagram illustrating references for negative Vds sensing in accordance with a preferred embodiment of the present invention.

Referring now to FIG. 11, an exemplary circuit 320 implementing the negative Vds voltage sense reference is illustrated. Low side negative overcurrent reference 322 is shown as being taken off a resister 323. An LDMOS transistor 126 connected in a reverse direction is provided to emulate the body diode of the low side FET for building a negative Vds sense reference for the low side FET. Transistor 325 is a 50 V depMOS connected in parallel with the source of reverse LDMOS transistor 326. Transistor 325 provides an emulation of the low side FET substrate diode to contribute to forming the negative reference for the low side FET Vds voltage measurement.

Figure 12:
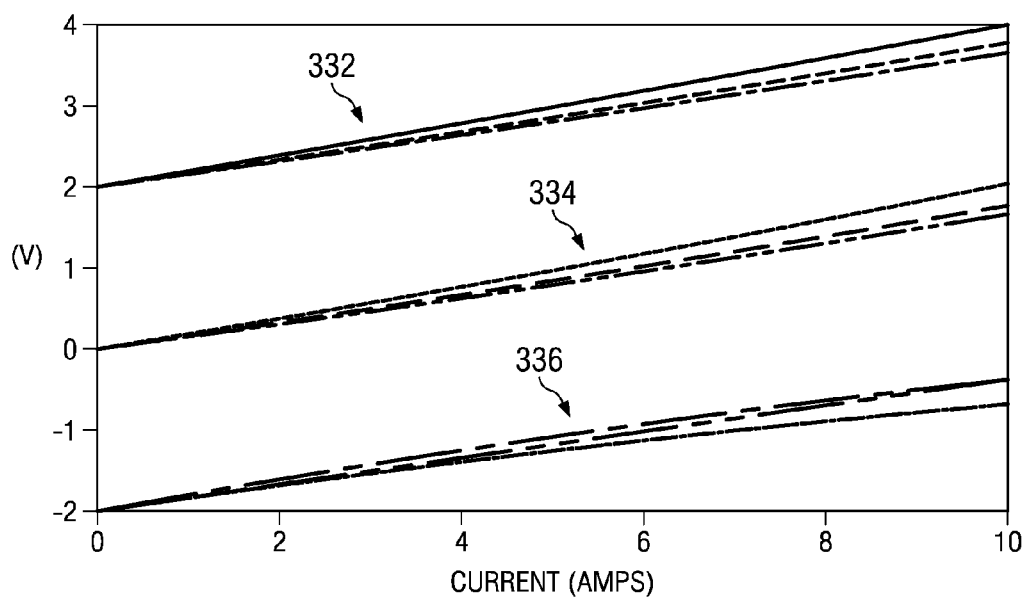
FIG. 12 is a graph illustrating nominal reference voltage values.

The measurement of Vds voltage to detect current through a transistor is somewhat susceptible to environmental conditions, such as temperature. Referring to FIG. 12, a number of plots of Vds voltages with transistor current changing from 0 to 10 Amps is shown. A 20% range of transistor voltage operation is provided as an indicator for usefulness of the reference values. For example, plot group 332 provides 110% of FET voltage, 90% of FET voltage and the negative high side reference voltage in between. Similarly, group 334 provides 110% and 90% of FET voltage on either side of the positive Vds reference. Plot group 336 provides the negative low side Vds reference, surrounded by the 110% and 90% of FET voltage plots. For illustration purposes, the high side FET Vds voltage in reverse conduction is upshifted by 2 volts, while the low side FET Vds voltage in reverse conduction is downshifted by 2 volts, so that the illustrative plots do not overlap. As can be seen from the graph in FIG. 12, the negative reference voltage for the low side and high side switch, as well as the positive reference, varies somewhat over the range of operation with respect to a 20% window, as defined by the 110% and 90% FET voltage plot lines. Ideally, the reference voltage should be close to the center of the 110% and 90% value of the FET voltage. However, the relationship illustrated in FIG. 12 permits a fairly accurate determination of FET current through the measurement of voltage Vds, over a significant temperature range.

A preferred embodiment of present invention provides a comprehensive overcurrent detection mechanism by observing transistor Vds voltage in both a negative and positive sense. The additional information provided by the negative Vds sensing, together with positive Vds sensing, relaxes the speed requirement for the overcurrent detector. In addition, negative Vds voltage sensing overcomes the drawback of overcurrent detection gaps, where overcurrent conditions may occur that are not detected with positive Vds voltage sensing alone. A preferred embodiment of present invention provides a technique for discontinuing a PWM cycle, or skipping a cycle, based on positive or negative Vds voltage sensing. According to one aspect of a preferred embodiment of the present invention, negative Vds voltage is sensed and converted to a related positive Vds voltage, for use with existing positive Vds voltage sensing circuitry. A preferred embodiment of also provides a spike suppressor for reducing a switching spike that typically interferes with Vds voltage sensing. The previous use of a blanking interval is removed, and a performance increase is realized. A preferred embodiment of also provides negative Vds voltage references that permit current detection to track with variations in process and temperature conditions. A preferred embodiment of permits circuitry to be reused to reduce the increase in circuitry used to realize the entire overcurrent detection technique using both positive and negative Vds sensing. For example, it is possible to achieve a small circuitry area increase of approximately 25% by combining comparators used in the overcurrent detection. The combination of comparators increases the overcurrent detection window that is available with shorts from power to ground at high temperatures, however this trade-off may be acceptable for a number of applications.

Although the present invention has been described in relation to particular embodiments thereof, other variations and modifications and other uses will become apparent to those skilled in the art from the description. It is intended therefore, that the present invention not be limited not by the specific disclosure herein, but to be given the full scope indicated by the appended claims.

What is claimed is:

1. An apparatus comprising:
    a driver;
    a bridge coupled to the driver, wherein the bridge includes a plurality of driving FETs coupled in series with one another;
    a plurality of current sensors, wherein each current sensor is coupled across at least one of the driving FETs, and wherein each current sensor comprises at least one sensing FET;
    a plurality of comparators, wherein each comparator compares a sensed current of at least one of the current sensors to a reference voltage to determine if an overcurrent condition exists, and wherein the comparators are coupled to the driver so as to influence the switching of the bridge, and wherein the plurality of comparators share a plurality of FETs; and
    a plurality of current mirrors, wherein each current mirror is coupled to at least one comparator.

2. The apparatus of claim 1, wherein at least one of the current sensors causes a switching to be skipped.

3. The apparatus of claim 1, wherein the apparatus further comprises a spike suppressor coupled to at least one of the comparators.

4. An apparatus comprising:
    a driver;
    a switching half-bridge coupled to the driver, wherein the bridge includes:
        a first FET coupled to a voltage source; and
        a second FET coupled to the first FET and to ground;
    a first current sensor coupled across the first FET;
    a second current sensor coupled across the second FET;
    a first comparator having a plurality of FETs, wherein the first comparator compares a current sensed by the first current sensor to a first reference voltage to determine if an overcurrent condition exists, and wherein the first comparator is coupled to the driver so as to influence the switching of the bridge;
    a first current mirror coupled to the first comparator;
    a second comparator having a plurality of FETs, wherein the second comparator compares a current sensed by the second current sensor to a first reference voltage to determine if an overcurrent condition exists, and wherein the second comparator is coupled to the driver so as to influence the switching of the bridge, and wherein the first and second comparators share a plurality of FETs; and
    a second current mirror coupled to the second comparator.

5. The apparatus of claim 1, wherein at least one of the current sensors causes a switching to be skipped.

6. The apparatus of claim 1, wherein the apparatus further comprises a spike suppressor coupled to at least one of the comparators.

* * * * *